(12) United States Patent
Shaikevitch et al.

(10) Patent No.: US 8,410,681 B2
(45) Date of Patent: Apr. 2, 2013

(54) LIGHT EMITTING DEVICE HAVING A REFRACTORY PHOSPHOR LAYER

(75) Inventors: Alex Shaikevitch, Sunnyvale, CA (US); Chris Lowery, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 110 days.

(21) Appl. No.: 12/164,577

(22) Filed: Jun. 30, 2008

(65) Prior Publication Data

US 2009/0322208 A1 Dec. 31, 2009

(51) Int. Cl.
*H01J 1/62* (2006.01)
*H01J 63/04* (2006.01)
(52) U.S. Cl. ......... 313/503; 313/498; 313/506; 313/512
(58) Field of Classification Search ........... 313/498–512
See application file for complete search history.

(56) References Cited

U.S. PATENT DOCUMENTS

| | | | |
|---|---|---|---|
| 7,091,656 B2 | 8/2006 | Murazaki et al. | |
| 2002/0180351 A1* | 12/2002 | McNulty et al. | 313/512 |
| 2004/0095063 A1* | 5/2004 | Murazaki et al. | 313/503 |
| 2004/0129946 A1* | 7/2004 | Nagai et al. | 257/98 |
| 2005/0190561 A1* | 9/2005 | Ng et al. | 362/307 |
| 2006/0006793 A1* | 1/2006 | Baroky et al. | 313/502 |
| 2007/0131954 A1 | 6/2007 | Murayama et al. | |
| 2007/0145397 A1 | 6/2007 | Denbaars et al. | |
| 2007/0241357 A1* | 10/2007 | Yan | 257/98 |
| 2007/0295969 A1 | 12/2007 | Chew et al. | |
| 2008/0054280 A1 | 3/2008 | Reginelli et al. | |
| 2008/0142817 A1* | 6/2008 | Ibbetson et al. | 257/88 |
| 2008/0303044 A1* | 12/2008 | Kohno et al. | 257/98 |

FOREIGN PATENT DOCUMENTS

| | | |
|---|---|---|
| CN | 1930695 | 3/2007 |
| JP | 2006-303140 A | 11/2006 |
| JP | 2006303140 A | 11/2006 |
| JP | 20072207347 A | 8/2007 |
| JP | 2008130279 A | 6/2008 |
| KR | 20070007019 A | 1/2007 |

OTHER PUBLICATIONS

Notification of Transmittal of International Search Report and Written Opinion, International Search Report and Written Opinion in International Application No. PCT/US2009/048728 dated Nov. 3, 2009.
Notification of Transmittal of International Preliminary Report on Patentability, and International Preliminary Report on Patentability in International Application No. PCT/US2009/048728 dated Jun. 5, 2012.
Office Action in Taiwanese Patent Application No. 098121797 completed Jul. 16, 2012.
Notice of Preliminary Rejection in Korean Application No. 10-2010-7029808 mailed Feb. 14, 2012.
Abstract of Korean Application No. 2007-0007019 published Jan. 12, 2007.
Notification of Reasons for Rejection in Japanese Application No. 2011-516687 forwarded Jul. 24, 2012.
Abstract of JP 2006-303140 published Nov. 2, 2006.

(Continued)

*Primary Examiner* — Anh T. Mai
*Assistant Examiner* — Kevin Quarterman

(57) ABSTRACT

A light emitting device and method of producing the same is disclosed. The light emitting device includes a transparent thermal conductor layer, a refractory phosphor layer provided on the transparent thermal conductor layer, and a light emitting semiconductor arranged to emit light toward the transparent thermal conductor layer and the refractory phosphor layer.

15 Claims, 3 Drawing Sheets

OTHER PUBLICATIONS

Abstract of JP 2007-220737 published Aug. 30, 2007.
Abstract of JP 2008-130279 published on Jun. 5, 2008.
English translation of SIPO Office Action for related Chinese patent application 200980132884.4, dated Nov. 13, 2012.

* cited by examiner

LIGHT EMITTING DEVICE HAVING A REFRACTORY PHOSPHOR LAYER

BACKGROUND

1. Field

The present disclosure relates to light emitting devices, and more particularly, to semiconductor light emitting devices having a refractory phosphor layer.

2. Background

Light emitting diodes (LEDs) are attractive candidates for replacing conventional light sources, such as incandescent lamps and fluorescent light sources. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Furthermore, LEDs require lower voltages than fluorescent lamps, and therefore, are better suited for applications in which the light source must be powered from a low-voltage source, such as a battery or an internal computer DC power source.

Unfortunately, LEDs produce light in a relatively narrow spectrum band. To replace conventional lighting sources, LEDs that generate light that appears to be "white" to the human observer are required. A light source that appears to be white and that has a conversion efficiency comparable to that of fluorescent light sources can be constructed from a blue light emitting semiconductor covered with a layer of phosphor that converts a portion of the blue light to yellow light. If the ratio of blue to yellow light is chosen correctly, the resultant light source appears white to a human observer. In applications requiring high power illumination, however, the phosphor layer may overheat. The heat, if not sufficiently dissipated, may cause premature degradation of the phosphor layer, decreasing the device's performance and life-span.

To prevent the phosphor layer from overheating, many contemporary devices are designed with the phosphor layer mounted further away from the light emitting semiconductor. This approach, however, creates additional problems. Increasing the distance between the phosphor layer and the light emitting semiconductor increases the size of the device, and thus, can increase the manufacturing cost of the device. Moreover, such a design does not effectively address the heat dissipation issue as it does not provide any means for dissipating the heat away from the phosphor layer.

Accordingly, although contemporary LEDs have proven generally suitable for their intended purposes, they possess inherent deficiencies which detract from their overall effectiveness and desirability. As such, there exists a need for small, high-power "white light" LEDs with a system for dissipating heat from the phosphor layer.

SUMMARY

In one aspect of the disclosure, an apparatus includes a transparent thermal conductor layer, a refractory phosphor layer provided on the transparent thermal conductor layer, and a light emitting semiconductor arranged to emit light toward the transparent thermal conductor layer and the refractory phosphor layer.

In another aspect of the disclosure, a light emitting device includes a refractory phosphor layer fused onto a transparent layer having a thermal conductivity greater than that of the refractory phosphor layer.

In a further aspect of the disclosure, a method for manufacturing a light emitting device includes depositing at least one phosphor mixture onto a transparent substrate, wherein the phosphor mixture includes a phosphor powder, a glass frit, and a binder.

In yet a further aspect of the disclosure, a method for manufacturing a light emitting device includes fusing a refractory phosphor layer onto a transparent layer.

It is understood that other aspects of light emitting devices will become readily apparent to those skilled in the art from the following detailed description, wherein it is shown and described only in examples of various aspects of light emitting devices by way of illustration. As will be realized, the various aspects of light emitting devices disclosed herein are capable of modification in various other respects, all without departing from the spirit and scope of the present disclosure. Accordingly, the drawings and detailed description that follow are to be regarded as illustrative in nature and not as restrictive.

BRIEF DESCRIPTION OF THE DRAWINGS

Various aspects of the present disclosure are illustrated by way of example, and not by way of limitation, in the accompanying drawings, wherein.

DETAILED DESCRIPTION

The detailed description set forth below in connection with the appended drawings is intended as a description of various aspects of light emitting devices and is not intended to represent all ways in aspects of the present invention may be practiced. The detailed description may include specific details for the purpose of providing a thorough understanding of various aspects of light emitting devices; however, it will be apparent to those skilled in the art that the present invention may be practiced without these specific details. In some instances, well-known structures and components are summarily described and/or shown in block diagram form in order to avoid obscuring the concepts of the present invention.

Furthermore, various descriptive terms used herein, such as "provided on" and "transparent," should be given the broadest meaning possible within the context of the present disclosure. For example, when a layer is said to be "provided on" another layer, it should be understood that that one layer may be deposited, etched, attached, or otherwise prepared or fabricated directly or indirectly above that other layer. Also, something that is described as being "transparent" should be understood as having a property allowing no significant obstruction or absorption of electromagnetic radiation in the particular wavelength (or wavelengths) of interest.

Figure 1:
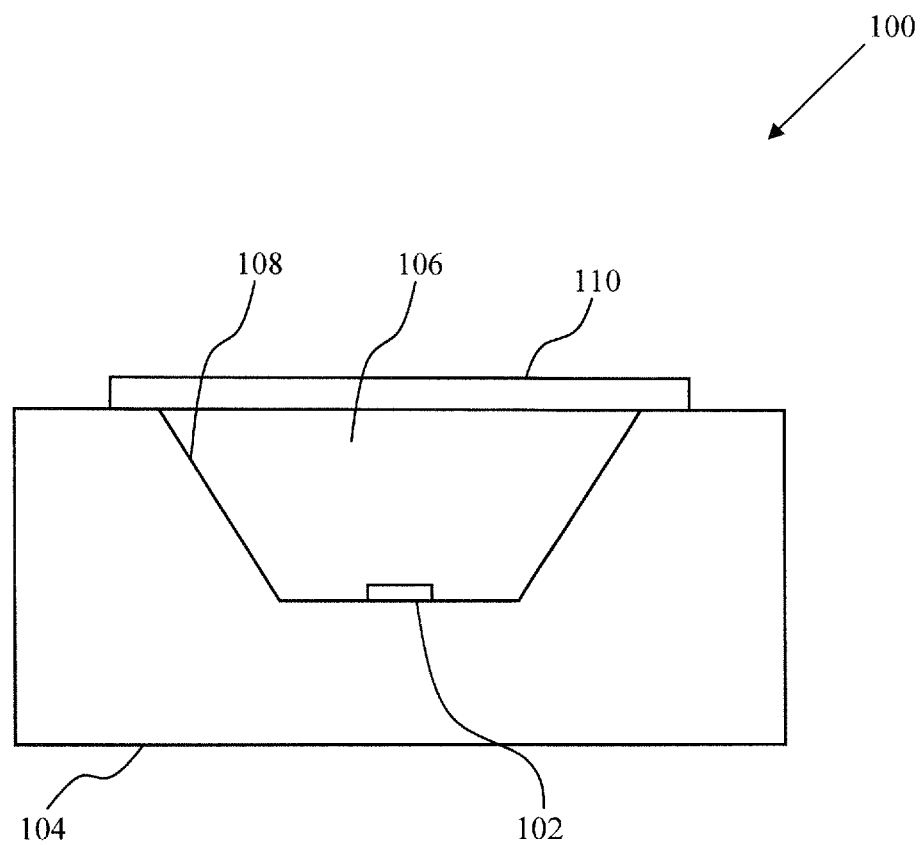
FIG. 1 is a cross-section view illustrating an example of a light emitting device.

FIG. 1 is a cross-section view illustrating an example of a light emitting device 100. In this example, the device may include a blue light emitting semiconductor 102 provided within a recessed housing 104. The light emitting semiconductor 102 may be driven by a power source (not shown) that is electrically coupled to the light emitting semiconductor 102 via electrically conductive traces (not shown). The recessed housing 104 may be formed by boring a cavity 106, such as a conical cavity, for example, in a layer of a material, such as ceramic, resin, polyphthalamyde, polycarbonate, or some other suitable material. An inner wall 108 of the recessed housing 106 may be coated with a reflective material such as, for example, aluminum, sliver, or a suitable plastic impregnated via injection molding with titanium dioxide. The cavity 106 may be filled with an index-matching material, such as silicone, or with an oxygen reducing gas, such as nitrogen, for example. Thereafter, a phosphor layer 110 may be provided on the recessed housing 104, covering the cavity 106.

The phosphor layer 110 is used in combination with the light emitting semiconductor 102 to create light with a range of color temperatures and spectral composition. The phosphor layer 110 may include a mixture of silicone and phosphor particles, which are evenly dispersed and suspended within the silicone. The phosphor particles may be of different colors (e.g., yellow, red, blue) in order to enhance a color rendering index of the light produced by the device 100. The phosphor layer 110 may have a round disk-like shape in order to provide a uniform radiation pattern.

During operation, the light emitting semiconductor 102 may emit a blue light. A portion of the blue light may be absorbed by the phosphor particles of the phosphor layer 110 and the remaining blue light may pass through the phosphor layer 110. Once the blue light is absorbed by a phosphor particle, the phosphor particle may emit a light of its respective color. This secondary emission of colored light from the phosphor particle, also known as a Stokes shift, is optically mixed with the remaining blue light, and the mixed spectra thus produced is perceived by the human eye as being white.

Unfortunately, the Stokes Shift process for converting blue light to other wavelengths in the phosphor is not 100% efficient. Each photon of blue light absorbed by the phosphor particle may not always produce a photon of a different wavelength. This lost energy is absorbed by the phosphor and is emitted as heat into the phosphor layer 110. For small devices, this generated heat is very small and typically has no significant effect on the performance of the device. But for more powerful devices, such as those exceeding 1 watt in consumed electrical power, the amount of heat generated inside the phosphor layer becomes significant if it is not sufficiently dissipated. Excessive heat may consequently degrade the phosphor layer and reduce its efficiency that is, the phosphor layer will still absorb the same amount of radiant optical power, but will emit less light. As a result, the luminance may decrease and the color temperature may shift from white to blue, adversely affecting the performance of the device 100. In order to dissipate the heat generated within the phosphor layer 110, a heat dissipating structure may be integrated into the light emitting device, as shown in FIG. 2.

Figure 2:
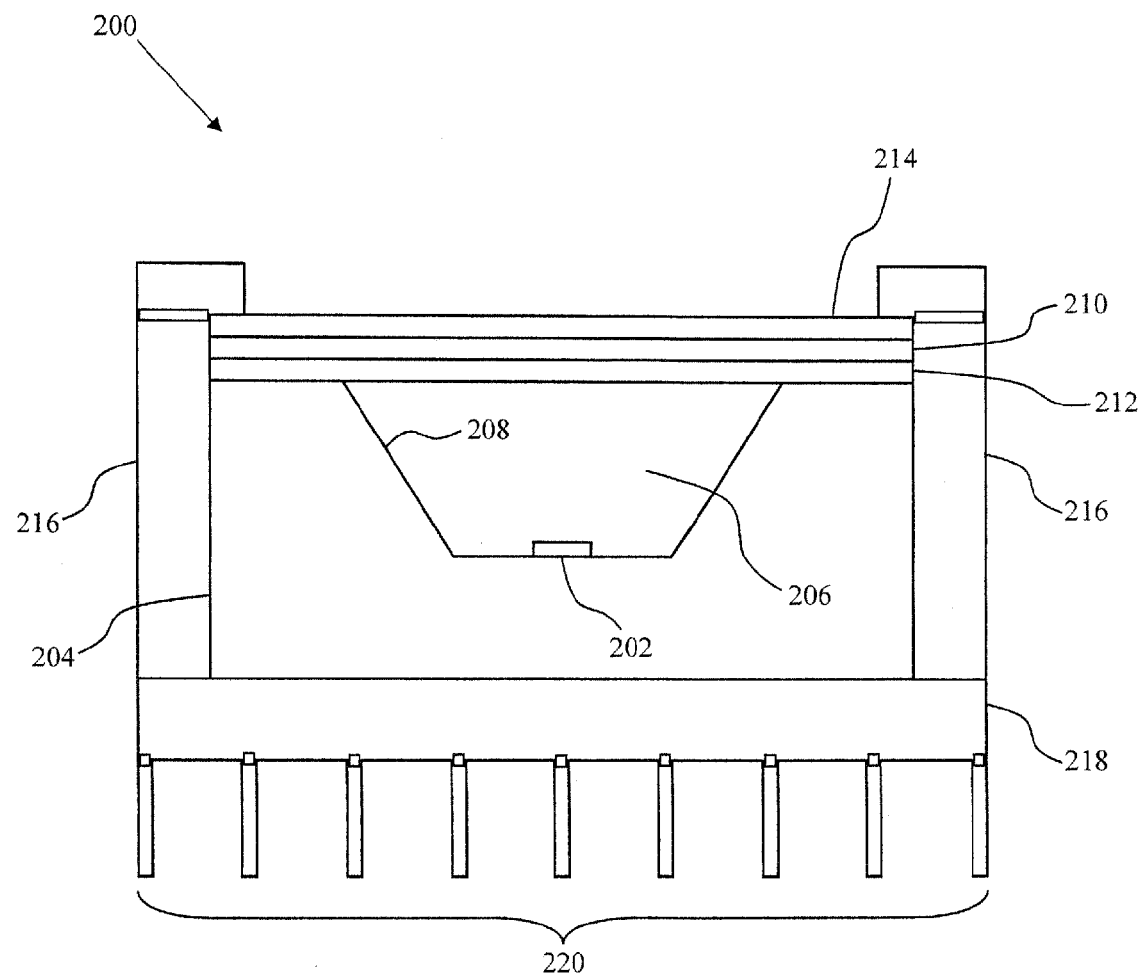
FIG. 2 is a cross-section view illustrating an example of a light emitting device having a refractory phosphor layer.

FIG. 2 is a cross-section view illustrating an example of a device 200 having a heat dissipating structure with a refractory phosphor layer 214. Light emitting semiconductor 202, recessed housing 204, reflective inner wall 208, and cavity 206 of FIG. 2 correspond to the light emitting semiconductor 102, recessed housing 104, reflective inner wall 108, and cavity 106 of FIG. 1, respectively, and as such, their respective descriptions are omitted. The heat dissipating structure of device 200 may include a transparent layer 210, a metal housing 216, a metal substrate 218, and fins 220. The metal housing 216, the metal substrate 218, and the fins 220 may all be composed of a heat conductive material, such as copper, aluminum, aluminum nitride, or diamond, for example.

The phosphor layer 214 may be fused onto the transparent layer 210 so as to form an integrated glass-like layer. The transparent layer 210 may be a transparent and heat conductive material, such as, for example, glass, sapphire, or diamond. The phosphor layer 214, after being fused onto the transparent layer 210, may be a refractory glass-like layer including phosphor particles of one or a plurality of colors (e.g., yellow, red, green). The process of fusing the phosphor layer 214 onto the transparent layer 210 is described in detail later with reference to FIG. 3.

Once fused, the phosphor layer 214 and the transparent layer 210 may be provided on the recessed housing 204, covering the cavity 206. Although FIG. 2 shows the phosphor layer 214 as being located over the transparent layer 210, the order of the layers may be reversed such that the phosphor layer 214 is located below the transparent layer 210.

Optionally, a mirror 212, such as a Bragg mirror (DBR), may be provided below the transparent layer 210 and the phosphor layer 214. The mirror 212, for example, may be composed of alternating titanium dioxide and silicon dioxide layers of a particular thickness. The mirror 212 may be designed to transmit short wavelength light (e.g., blue) that is emitted by the light emitting semiconductor 202, but reflect the longer wavelength light (e.g., red, yellow) emitted by the phosphor layer 214. This prevents the light rays emitted by the phosphor layer 214 from entering the cavity 206 where they may potentially become lost and instead reflects such rays out of the device 200. As such, the mirror 212 may improve the efficiency of the device 200.

The recessed housing 204 including the light emitting semiconductor 202 and the phosphor layer 214, the transparent layer 210, and the mirror 212 may be provided within a metal casing composed of the metal housing 216 and the metal substrate 218. The metal housing 216 may be bonded to the metal substrate 218 by capacitance discharge welding or some other suitable method. The recessed housing 204 may be bonded to the metal substrate 218 by some suitable chemical and/or mechanical bonding method. Once within the metal casing, the phosphor layer 214, the transparent layer 210, and the mirror 212 may be secured to the recessed housing 204 by some method suitable to hermetically seal the cavity 206. For example, the layers 214, 210, 212 may be crimped to the recessed housing 204 by mechanically folding over the edges of the metal housing 216, as shown in FIG. 2. By hermetically sealing the device 200 in such a manner configures the device 200 to withstand extreme fluctuations in temperature, pressure, and other environmental conditions.

In addition to providing a hermetic seal, crimping the layers 214, 210, 212 via the metal housing 216 ensures that the phosphor layer 214 and the transparent layer 210 are thermally coupled to the metal housing 216, which itself is thermally coupled to the metal substrate 218 and the fins 220, establishing the thermal conduction circuit of the heat dissipating structure.

During operation of the device 200, the heat generated by the phosphor particles in the phosphor layer 214 may be dissipated from the phosphor layer 214 to the metal housing 216 via the phosphor layer 214 itself as well as the transparent layer 210. The metal housing 216 transfers the heat to the metal substrate 218, which in turn vents the heat to the outside environment via the fins 220. As such, the phosphor layer 214 is cooled, preventing the degradation of the phosphor layer 214.

Figure 3:
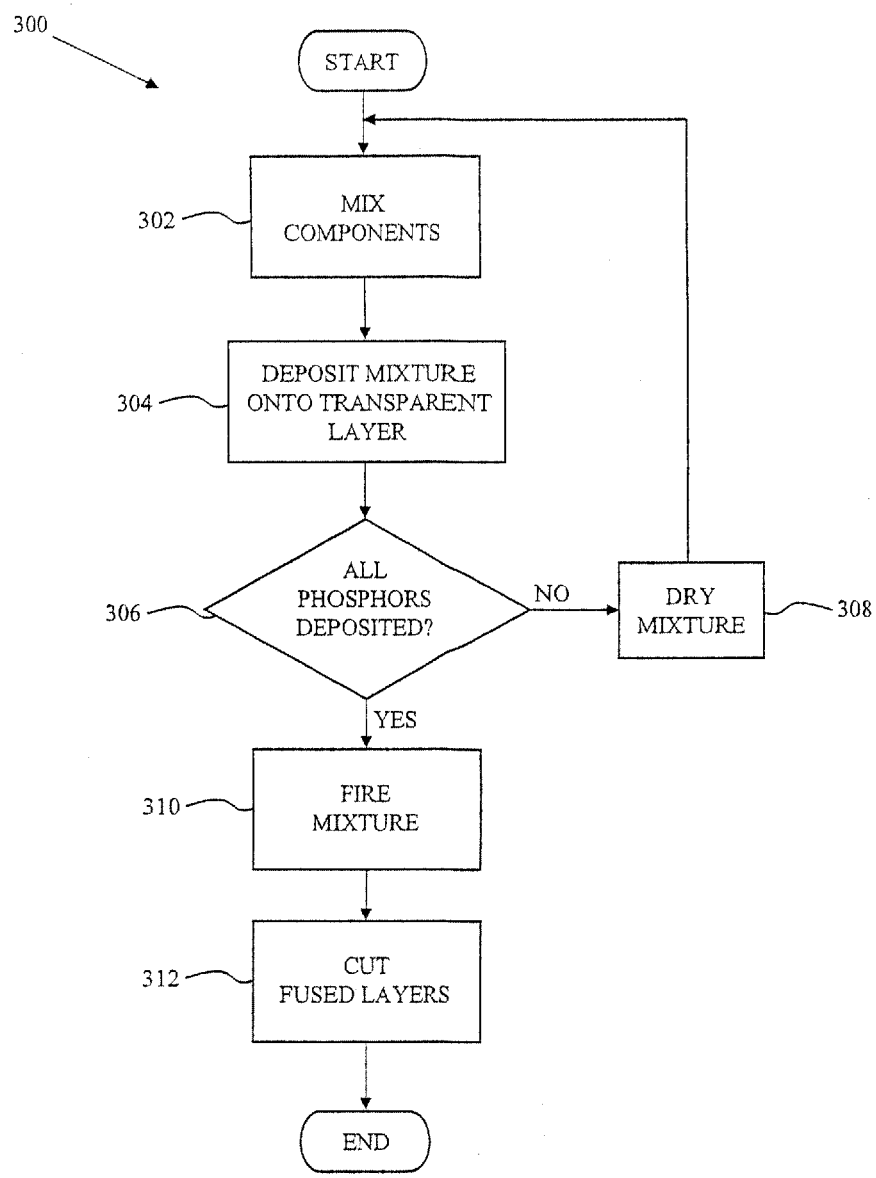
FIG. 3 is a flow-chart diagram illustrating an example of a process for providing a refractory phosphor layer on a transparent layer.

FIG. 3 is a flow-chart diagram 300 illustrating an example of a process for combining the phosphor layer 214 and the transparent layer 210. The process begins and proceeds to block 302, where various components of the phosphor layer 214 are mixed. For example, a specific amount of phosphor powder may be mixed with a specific amount of glass frit, organic binder, and glass flux. The phosphor powder, for example, may be of a particular color or a combination of colors (e.g., yellow, red, green) and of a particular type, such as garnet structure phosphors (e.g., yttrium aluminum garnet, terbium aluminum garnet), sulfide phosphors (e.g., zinc sulfide, strontium sulfide), selenide phosphors (e.g., cadmium selenide, zinc selenide), silicate phosphors (e.g. barium silicate, strontium silicate, calcium silicate) and alkali halide phosphors (e.g., cesium chloride, potassium bromide). The phosphor powder may contain phosphor particles having a diameter of about 3 µm to 25 µm, but is not limited thereto. The glass frit may be any suitable type of powdered glass. The organic binder may be any suitable organic dispersant that is burnt off during firing at or below 600° Celsius., and may contain compounds such as zinc oxide, lead oxide, and borax, for example. The phosphor powder, glass frit, organic binder, and glass flux may be mixed in order to effectively mix and degas the mixture so that the phosphor particles are suspended and evenly dispersed within the mixture and the mixture is substantially devoid of gas bubbles.

Once the mixture is prepared, the process proceeds to block 304, where the mixture is uniformly deposited onto a transparent substrate, such as the transparent substrate 210, via screen-printing, stenciling, or some other suitable method. A device, such as that used for manufacturing circuit boards, may be used for this purpose. The mixture may be deposited to cover all or a portion of the transparent layer as one continuous layer, a particular pattern, or an array of dots, for example. The thickness of the deposited mixture may be controlled to obtain a desired final thickness of the phosphor layer.

After the mixture is deposited, the process proceeds to block 306, where a determination is made as to whether all of the desired phosphors are present on the transparent layer. If it is determined that not all of the desired phosphors are present on the transparent layer, then the process proceeds to block 308. At block 308, the mixture is dried for a predetermined amount of time, and the process proceeds back to block 302 where a phosphor powder of another type and/or color is mixed with the glass frit, organic binder, and glass flux. The process then proceeds down through blocks 302-306 until all of the desired phosphors are present on the transparent layer.

In such a case where the process undergoes an iteration for each different phosphor powder, in block 304, each phosphor mixture may be deposited as a particular pattern and/or an array of dots on the transparent layer. The resulting phosphor layer may thus be a combination of patterns and/or dot arrays of different phosphor mixtures. This may be done with a specific lithographic pattern when screen-printing each mixture. The array may be such that each phosphor mixture is deposited so as not to overlap with a neighboring phosphor mixture. It may be desirable to deposit the different phosphors in such an array to decrease the absorption of light by neighboring phosphor particles of different color. Furthermore, depositing each phosphor mixture separately allows for incompatible phosphor mixtures to exist within the resulting phosphor layer, wherein the incompatible phosphor mixtures are localized within their respective areas within the array.

If at block 306 it is determined that all of the desired phosphors are present on the transparent layer, then the process proceeds to block 310.

At block 310 the transparent layer with the deposited mixture is fired in a furnace where the mixture is fused to the transparent layer. The furnace, for example, may be a multi-zone belt furnace where the mixture is heated to a specific temperature (e.g., 600° Celsius.), cooled, and annealed within a period of 30-40 minutes. As the mixture melts and fuses to the transparent layer it acquires a refractive glass-like property (i.e., it becomes a refractive phosphor layer). Due to the similar inorganic compositions of the refractive phosphor layer and the transparent layer, the resulting bond between these layers may include exceptional chemical and optical characteristics.

After the refractive phosphor layer is fused to the transparent layer in block 310, the process proceeds to block 312 where the refractive phosphor layer and transparent layer are cut into discs of a predetermined shape (e.g., circle, square) by a die cutter or a similar device. After block 312, the process ends.

Prior to attaching the discs to their respective optical devices, such as the device 200 shown in FIG. 2, each disc may be tested for various performance characteristics (e.g., color temperature).

LEDs with a heat dissipation structure including a refractive phosphor layer may be used in numerous applications. By way of example, these LEDs may be well suited for liquid crystal display (LCD) backlighting applications. Other applications may include, but are not limited to, automobile interior lighting, light bulbs, lanterns, streetlights, flashlights, or any other application where LEDs are used.

The above description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus, comprising:
   a transparent thermal conductor layer, wherein the transparent thermal conductor layer is coupled to a thermally conductive enclosure comprising a recessed housing comprising a cavity and a metal housing, wherein the cavity is sealed;
   a reflective layer displaced on an inner surface of the cavity;
   a refractory phosphor layer provided on the transparent thermal conductor layer, wherein the refractory phosphor layer is fused to the transparent thermal conductor layer and the cavity is sealed by the transparent thermal conductive layer provided with the refractory phosphor layer being crimped between the recessed housing and a portion of the metal housing; and
   a light emitting semiconductor arranged to emit light toward the transparent thermal conductor layer and the refractory phosphor layer, wherein light that is not emitted towards the refractory phosphor layer is reflected by the reflective layer.

2. The apparatus of claim 1, wherein the transparent thermal conductor layer is configured to dissipate heat from the refractory phosphor layer.

3. The apparatus of claim 1, further comprising a Bragg mirror provided below the refractory phosphor layer.

4. The apparatus of claim 1, wherein the metal casing is configured to dissipate heat from the refractory phosphor layer.

5. The apparatus of claim 1, wherein the refractory phosphor layer forms an array of phosphor dots or a plurality of separate patterns on the transparent thermal conductor layer.

6. The apparatus of claim 5, wherein the phosphor sections are an array of phosphor dots.

7. The apparatus of claim 5, wherein the phosphor sections are a plurality of separate phosphor patterns.

8. The apparatus of claim 5, wherein at least one of the phosphor sections is configured to produce light of a color different from that of at least another one of the phosphor sections.

9. The apparatus of claim 5, wherein at least one of the phosphor sections comprises phosphor particles of a type different from that of at least another one of the phosphor sections.

10. The apparatus of claim 1, wherein the transparent layer is formed of a material selected from a group consisting of glass, sapphire, and diamond.

11. A light emitting device, comprising:
a refractory phosphor layer fused onto a transparent layer comprising a thermal conductivity greater than that of the refractory phosphor layer, wherein the transparent layer is coupled to a thermally conductive enclosure comprising a recessed housing comprising a cavity and a metal housing, wherein the cavity is sealed by the transparent thermal conductive layer provided with the refractory phosphor layer being crimped between the recessed housing and a portion of the metal housing; and
a reflective layer displaced on an inner surface of the cavity, wherein the reflective layer is configured to reflect light towards the transparent layer.

12. A method for manufacturing a light emitting device, comprising:
depositing at least one phosphor mixture onto a transparent substrate, wherein the phosphor mixture comprises a phosphor powder, a glass frit, and a binder;
fusing the phosphor mixture to the transparent substrate;
thermally coupling the transparent substrate to a thermally conductive enclosure comprising a recessed housing comprising a cavity and a metal housing, wherein the cavity is sealed by the transparent thermal conductive layer provided with the refractory phosphor layer being crimped between the recessed housing and a portion of the metal housing; and
depositing a reflective layer on an inner surface of the cavity, wherein the reflective layer is configured to reflect light towards the transparent substrate.

13. The method of claim 12, further comprising more than one phosphor mixture wherein one of the phosphor mixtures is deposited in a first array of phosphor sections and another one of the phosphor mixtures is deposited in a second array of phosphor sections such that the phosphor sections of the first array do not overlap the phosphor sections of the second array.

14. The method of claim 13, wherein at least one of the phosphor mixtures is configured to produce light of a color different from that of at least another one of the phosphor mixtures.

15. The method of claim 13, wherein at least one of the phosphor mixtures comprises phosphor particles of a type different from that of at least another one of the phosphor mixtures.

* * * * *